US006721230B2

(12) United States Patent
Weitz

(10) Patent No.: US 6,721,230 B2
(45) Date of Patent: Apr. 13, 2004

(54) INTEGRATED MEMORY WITH MEMORY CELLS IN A PLURALITY OF MEMORY CELL BLOCKS, AND METHOD OF OPERATING SUCH A MEMORY

(75) Inventor: Peter Weitz, Sauerlach (DE)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 10/217,936

(22) Filed: Aug. 13, 2002

(65) Prior Publication Data

US 2003/0039155 A1 Feb. 27, 2003

(30) Foreign Application Priority Data

Aug. 13, 2001 (DE) .......................................... 101 39 724

(51) Int. Cl.[7] ................................................ G11C 8/00
(52) U.S. Cl. ............................ 365/230.03; 365/189.07; 365/189.12
(58) Field of Search ...................... 365/230.03, 189.07, 365/189.12, 205, 189.01

(56) References Cited

U.S. PATENT DOCUMENTS 5,301,162 A * 4/1994 Shimizu ................ 365/230.03

FOREIGN PATENT DOCUMENTS

DE   40 18 438        1/1991
DE   100 41 688 A1    3/2002

* cited by examiner

Primary Examiner—David Lam
(74) Attorney, Agent, or Firm—Laurence A. Greenberg; Werner H. Stemer; Gregory L. Mayback

(57) ABSTRACT

An integrated memory including memory cells in a plurality of memory cell blocks, each memory cell block being assigned at least one dedicated data line and a register circuit that can be written from outside the memory. At the start of a test operation, data is stored in the register circuits as reference data. During an access cycle, in each case in each of the memory cell blocks, a respective memory cell or a group of memory cells is selected, a respective read amplifier is activated and, in each of the register circuits, a comparison between the data read out and the reference data is carried out. As a result, the time required for the test operation of the memory is made comparatively low.

12 Claims, 2 Drawing Sheets

FIG 2
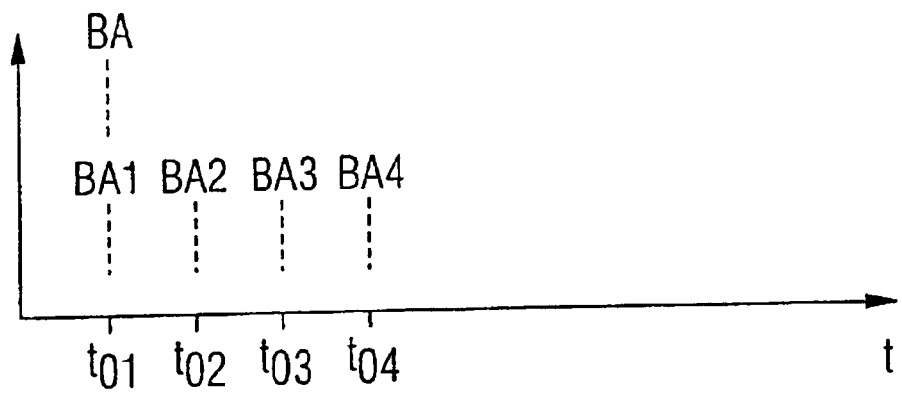
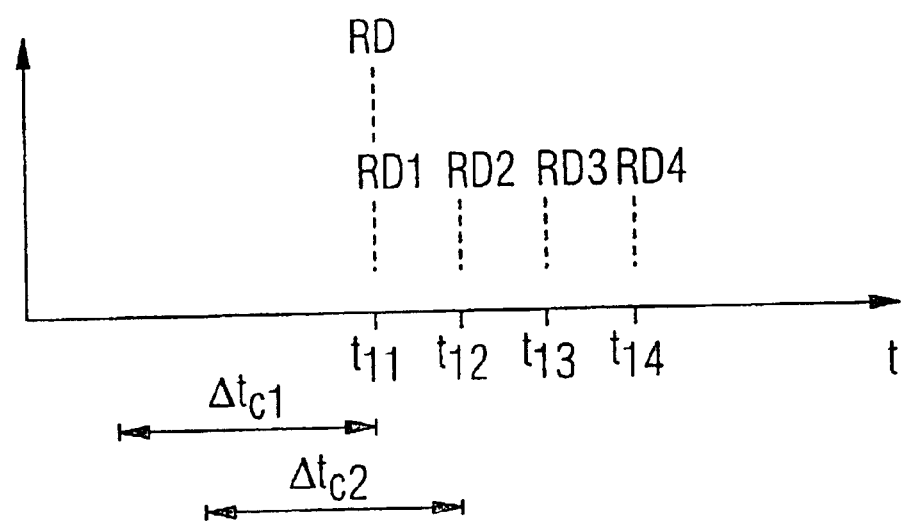
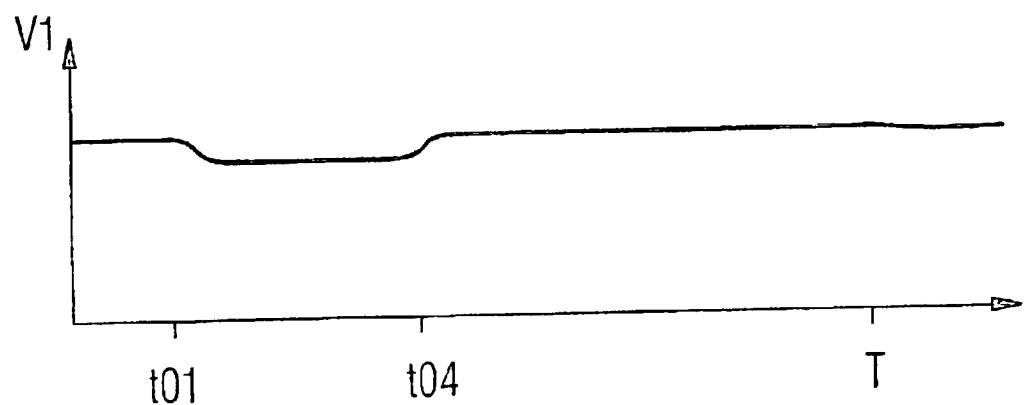

INTEGRATED MEMORY WITH MEMORY CELLS IN A PLURALITY OF MEMORY CELL BLOCKS, AND METHOD OF OPERATING SUCH A MEMORY

BACKGROUND OF THE INVENTION

Field of the Invention

The present invention relates to an integrated memory with memory cells which are disposed in at least a first and second memory cell block, in which the memory cells can respectively be read out through a read amplifier and a data line connected to the read amplifier, each memory cell block being assigned at least one dedicated data line, and also to a method of operating such a memory.

Integrated memories often have memory cells in a plurality of separate, identical memory cell blocks. The memory cells are normally disposed at crossing points of word lines and bit lines, being connected in each case to one of the word lines to select one of the memory cells and to one of the bit lines.

During an access to one of the memory cells, generally the relevant word line is selected through a decoder. After the relevant word line has been selected, data signals from the memory cells along the word line are present on the corresponding bit lines. A data signal from a selected memory cell is assessed in a read amplifier of the relevant memory cell block, is amplified, and is read out through a data line associated with the memory cell block. If a memory has a plurality of separate memory cell blocks, for example, in the form of memory banks, as they are referred, the procedures described are normally carried out separately in each case for each of the memory banks.

For test operation of a memory, it is usual to write the same item of information into a plurality of memory cells and read it out again, the data read out being compared with reference data. As a result, it is possible, in particular, to determine whether or not tested memory cells are faulty. For such a purpose, provision is made, for example, of a comparison circuit belonging to the memory, by which data read out can be compared with reference data.

In particular, during test operation of a memory, in which the same item of information is written into a plurality of memory cells and read out again, there is a considerable saving in time as compared with the normal operation of the memory if memory cells of a plurality of memory banks are written with the same data in parallel for one memory cell access during an access cycle. For such a purpose, it is, in particular, necessary to activate a plurality of memory banks or their read amplifiers in parallel (multi-bank activation, as it is referred). A similar procedure when reading out test data is problematic because the test data from the different memory banks cannot generally be compared with reference data in parallel in a comparison register.

SUMMARY OF THE INVENTION

It is accordingly an object of the invention to provide an integrated memory with memory cells in a plurality of memory cell blocks, and method of operating such a memory that overcome the hereinafore-mentioned disadvantages of the heretofore-known devices and methods of this general type and that that makes it possible to keep the time required, in particular, for test operation of the memory comparatively low.

With the foregoing and other objects in view, there is provided, in accordance with the invention, an integrated memory, including memory cells disposed in at least first and second memory cell blocks, read amplifiers, data lines respectively connected to the read amplifiers, writable register circuits to be written from outside the memory, each of the memory cells respectively read out through one of the read amplifiers and one of the data lines connected to the one read amplifier, at least a dedicated one of the data lines being associated with each of the memory cell blocks for reading data from the memory cell blocks, at least a dedicated one of the register circuits being associated with each of the memory cell blocks, the register circuits adapted to store data and to compare the stored data with data applied to a respective one of the register circuits, and the dedicated one of the register circuits associated with a given one of the memory cell blocks being connected to the dedicated one of the data lines associated with the given memory cell block, the dedicated one of the register circuits adapted to compare data read out of the given memory cell block with the data stored in the dedicated one of the register circuits.

In the memory according to the invention, the time required for test operation of the memory is reduced by a plurality of memory banks and/or their read amplifiers being activated in parallel for a read access in multi-bank operation, as it is referred. The activation is made possible by the memory according to the invention because the memory has a plurality of writable register circuits to be written from outside the memory to store data (reference data) and to compare the stored data with applied test data. At the beginning of a test operation, the reference data is applied to the respective register circuit and stored therein. In such a case, each memory cell block is assigned at least one dedicated register circuit. To read the test data, for each memory cell block, the associated register circuit is connected to the associated data line so that a comparison between data to be read out from the respective memory cell block and the data stored in the associated register circuit can be carried out.

A memory cell access to read data stored in individual memory cells or in groups of memory cells is in this case carried out in an access cycle. During an access cycle, in each of the memory cell blocks, a respective memory cell or a group of memory cells is selected and respective read amplifiers are activated to read data to be read out. This means that, for the case in which a memory cell block corresponds to a memory bank, a so-called multi-bank operation is carried out, in which a plurality of memory banks, for example, belonging to a DRAM memory, are activated and read out in parallel. During an access cycle, the data read out is in each case compared with the reference data in parallel in the respective register circuits. A comparison result from a register circuit is, for example, output in the form of a pass/fail result, as it is referred. In such a case, a statement is made as to whether the test data agrees with the reference data or does not agree, from which statement it is possible to draw conclusions about the presence of a fault in the relevant memory cell block. These comparison results from the register circuits can either be output directly on corresponding data lines or, as an alternative thereto, can also firstly be logically linked with one another.

In such an embodiment of the invention, the register circuits respectively have an output for the output of a comparison result. The respective outputs of the register circuits can be connected to a combining circuit so that a combination of the comparison results at the outputs of the register circuits to form a resulting comparison result is carried out, by using which a test cycle of the entire memory can be assessed. If, for example, the comparison results from all the register circuits, and, therefore, the test results of all the memory cell blocks, "pass", then such a test cycle is judged to have passed. If at least one of the register circuits outputs a "fail" result, which means that the test data in at least one memory cell block does not correspond to the reference data, then such a test cycle is judged not to have passed.

In accordance with another feature of the invention, each of the memory cell blocks is associated with at least two of the register circuits and, for a respective one of the memory cell blocks, a first circuit of the register circuits and a second circuit of the register circuits store mutually inverted data.

With the objects of the invention in view, there is also provided a method of operating an integrated memory, including the steps of organizing memory cells into at least first and second memory cell blocks, respectively connecting data lines to read amplifiers, respectively reading out each of the memory cells through one of the read amplifiers and one of the data lines connected thereto, dedicating at least one of the data lines with each of the memory cell blocks for reading data therefrom, dedicating at least one writable register circuit to be written from outside the memory with each of the memory cell blocks, the register circuits adapted to store data and to compare the stored data with data applied to a respective one of the register circuits, connecting a dedicated one of the register circuits associated with a given one of the memory cell blocks to the dedicated data line associated with the given memory cell block, the dedicated one register circuit adapted to compare data read out of the given memory cell block with the data stored in the dedicated one register circuit, carrying out a memory cell access in an access cycle to read an item of data stored in a memory cell, at a start of a test operation section, storing data in the register circuits of the respective memory cell blocks as reference data, and during an access cycle, in each of the memory cell blocks, selecting at least one of a respective memory cell and a group of memory cells and activating a respective read amplifier to read data to be read out and respectively carrying out a comparison between the data read out and the reference data in each of the register circuits.

With the objects of the invention in view, the method of operating an integrated memory includes the steps of, during an access cycle, in each of the memory cell blocks, selecting at least one memory cell and activating a respective read amplifier to read out data and respectively carrying out a comparison between the data read out and the reference data in each of the register circuits.

In accordance with a concomitant mode of the invention, the memory cell blocks of the memory and/or their read amplifiers are activated with a time offset from one another during an access cycle. Such a process advantageously achieves the situation where a current demand produced by the activation is distributed over a certain time interval so that no brief and comparatively large voltage dip in the supply voltage is produced. Accordingly, in principle, any desired number of independent memory cell blocks or memory banks can be activated in a manner staggered over time. However, because the respective read amplifiers are, so to speak, activated in parallel in an access cycle to assess the respective data signals, the time required for a memory cell access, in particular, during test operation, can be kept comparatively low.

Other features that are considered as characteristic for the invention are set forth in the appended claims.

Although the invention is illustrated and described herein as embodied in an integrated memory with memory cells in a plurality of memory cell blocks, and method of operating such a memory, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a set of time graphs illustrating a time sequence of command signals for the operation of the memory according to FIG. 1.

DESCRIPTION OF PREFERRED EMBODIMENTS

Figure 1:
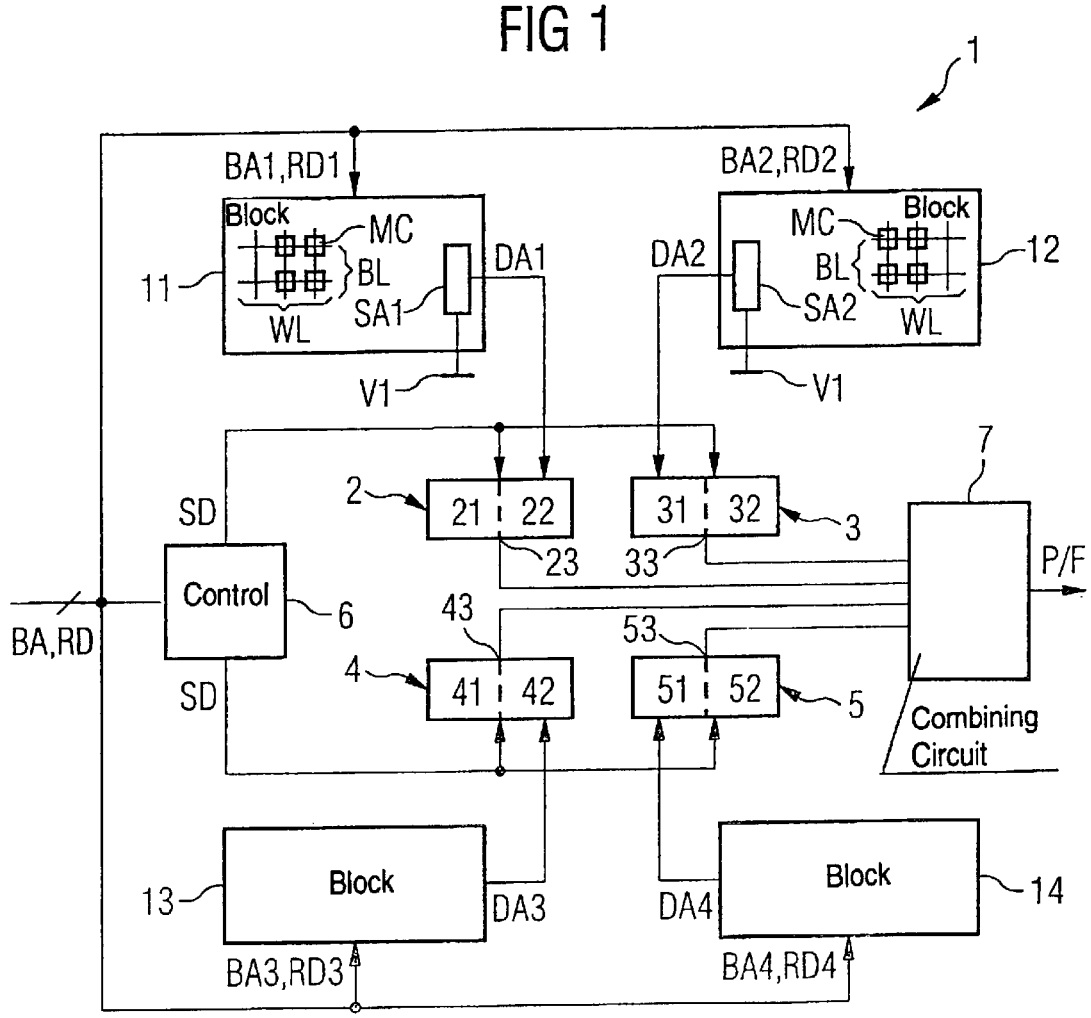
FIG. 1 is a block circuit diagram of an embodiment of an integrated memory according to the invention.

Referring now to the figures of the drawings in detail and first, particularly to FIG. 1 thereof, there is shown an embodiment of an integrated memory 1 that has memory cells that are in each case disposed in a plurality of memory cell blocks 11, 12, 13 and 14. Each of the memory cell blocks 11 to 14 is assigned a data line DA 1, DA 2, DA 3, DA 4. The memory cell blocks 11 to 14 are configured as memory banks in this exemplary embodiment. In principle, the invention can be used for all memory cell blocks to which a dedicated data line is assigned for reading data signals from memory cells. The memory cell blocks 11 to 14 each have bit lines BL and word lines WL, at whose crossing points memory cells MC are disposed, each being connected to one of the word lines WL and one of the bit lines BL.

The memory cells MC of the memory shown each contain a non-illustrated select transistor and storage capacitor. Control inputs of the select transistors are connected to one of the word lines WL, while a main current part of the select transistors is disposed between the memory capacitor of the respective memory cell MC and one of the bit lines BL. To select memory cells MC, the appropriate word line is activated. As a result, the relevant select transistor of a memory cell MC to be selected or a group of select transistors belonging to a plurality of memory cells to be selected is switched on.

Each of the memory cell blocks 11 to 14 has a read amplifier, illustrated in FIG. 1, by way of example, by using the read amplifiers SA1 and SA2 in the memory cell blocks 11 and 12. The read amplifiers SA1 and SA2 are used, in particular, to assess and to output a data signal from an appropriate selected memory cell MC. The read amplifiers SA1 and SA2 are connected to a supply voltage V1. The data lines DA1 to DA4 associated with the respective memory cell blocks are connected to the appropriate read amplifiers.

Each of the memory cell blocks 11 to 14 is assigned a register circuit 2, 3, 4, 5. The register circuit assigned to a memory cell block in each case can be connected to the data line associated with the same memory cell block. Explained, by way of example, using memory cell block 11, the register circuit 2 is connected to the data line DA1 to compare data to be read from the memory cell block 11 with the data stored in the register circuit 2. The stored data is read in at the start of a test operation, for example, as reference data SD.

The register circuits 2 to 5 additionally each have outputs 23, 33, 43, 53, which are used to output a comparison result of the comparison between data read from the respective memory cell block and data stored in the associated register circuit. The outputs 23 to 53 are connected to a combining circuit 7, by which the comparison results of the register circuits are combined logically to form a resulting comparison result P/F (here, as a pass/fail result). In the present exemplary embodiment, the register circuits 2 to 5 each have two part-register circuits, it being possible for respectively mutually inverted data to be stored in these (for example, in the case of complementary bit lines BL). In the example, mutually inverted data is stored in a first part-register circuit 21 and a second part-register circuit 22, which are respectively associated with the memory cell block 11.

At the start of a test operation, data SD is stored in the register circuits 2 to 5 as reference data through a control circuit 6. Because each of the memory banks 11 to 14 is assigned a dedicated register circuit, test data to be read from the memory banks can be compared with the stored reference data in a multi-bank operation. For such a purpose, all or a certain number of the memory banks and their read amplifiers are activated in parallel and read out. The data read out is compared with the reference data in parallel in the respective register circuits and only the "pass" or "fail" status is forwarded.

The comparison information (in this example, four comparison results) can be output either directly on corresponding data lines or, in another embodiment, as illustrated in FIG. 1, they are first combined logically with one another. If the comparison results from all the memory banks "pass", then the corresponding test cycle is likewise judged as a "pass". If the data read out from at least one memory bank does not correspond to the reference data, then a "fail" status is output from the combining circuit 7. It is, therefore, possible to output the pass/fail information either accumulated for all the memory banks on one pin of the memory or separately for each memory bank on different pins.

In a further advantageous embodiment of the invention, the activation of the read amplifiers of the memory banks in an access cycle is carried out with a time offset from one another so that quasi-parallel activation is carried out. Such a process is illustrated, by way of example, using FIG. 2, which shows a time profile of command signals for the operation of the memory according to FIG. 1.

As FIG. 2 illustrates, a memory cell access is carried out in an access cycle with the time duration T. During the access cycle, at least one respective memory cell is selected in each of the memory banks 11 to 14, by activating the relevant word line WL. For such a purpose, an activation command BA is applied to the control circuit 6. The individual activation commands BA1 to BA4 are generated from the activation command BA. By the activation commands BA1 to BA4, the corresponding read amplifiers are changed into an active state. In such a case, the activation is carried out with a time offset, by the activation signals BA1 to BA4 being output with a time offset from one another. The offset is carried out appropriately by the control circuit 6. The signal BA1 is generated at the time t01, the signal BA2 at the time t02, and so on. As a result of the staggered activation of the read amplifiers, only a comparatively low drop in the supply voltage V1 is still caused, and has no noticeable influence on the operation of the memory.

To read appropriate data signals in a test operation, a read command RD is applied to the control circuit 6. From such a command, in the same way as the command signals BA1 to BA4, the read commands RD1 to RD4 for the individual memory banks are generated by the control circuit 6. Here, the read accesses to the individual memory banks are delayed in the same order as during activation. The result is identical core-timing spacings $\Delta tc1$ and $\Delta tc2$, as they are referred. The generation of the individual read commands RD1 to RD4 is again performed in the control circuit 6. The read command RD1 for the memory bank 11 is generated at the time t11, the read command RD2 for the memory bank 12 is generated with a time offset at the time t12, and so on. Corresponding data signals are consequently read out in parallel, so to speak, within the cycle time T. As a result, in particular, the time duration for the test operation of the memory is shortened. In addition, a comparatively large dip in the supply voltage V1 is avoided. As a result, the timing behavior during the test operation is advantageously not changed, as compared with normal operation.

I claim:

1. An integrated memory, comprising:

memory cells disposed in at least first and second memory cell blocks;

read amplifiers;

data lines respectively connected to said read amplifiers;

writable register circuits to be written from outside the memory;

each of said memory cells respectively read out through one of said read amplifiers and one of said data lines connected to said one read amplifier;

at least a dedicated one of said data lines being associated with each of said memory cell blocks for reading data from said memory cell blocks;

at least a dedicated one of said register circuits being associated with each of said memory cell blocks;

said register circuits adapted to store data and to compare the stored data with data applied to a respective one of said register circuits; and said dedicated one of said register circuits associated with a given one of said memory cell blocks being connected to said dedicated one of said data lines associated with said given memory cell block, said dedicated one of said register circuits adapted to compare data read out of said given memory cell block with the data stored in said dedicated one of said register circuits.

2. The integrated memory according to claim 1, including a combining circuit, said register circuits each having an output for outputting a comparison result, said output of each of said register circuits being connected to said combining circuit, said combining circuit combining said comparison result of said register circuits and forming a combined comparison result.

3. The integrated memory according to claim 1, wherein:

each of said memory cell blocks is associated with at least two of said register circuits; and for a respective one of said memory cell blocks, a first circuit of said register circuits and a second circuit of said register circuits store mutually inverted data.

4. The integrated memory according to claim 2, wherein:

each of said memory cell blocks is associated with at least two of said register circuits; and for a respective one of said memory cell blocks, a first circuit of said register circuits and a second circuit of said register circuits store mutually inverted data.

5. A method of operating an integrated memory, which comprises:
   organizing memory cells into at least first and second memory cell blocks;
   respectively connecting data lines to read amplifiers;
   respectively reading out each of the memory cells through one of the read amplifiers and one of the data lines connected thereto;
   dedicating at least one of the data lines with each of the memory cell blocks for reading data therefrom;
   dedicating at least one writable register circuit to be written from outside the memory with each of the memory cell blocks, the register circuits adapted to store data and to compare the stored data with data applied to a respective one of the register circuits;
   connecting a dedicated one of the register circuits associated with a given one of the memory cell blocks to the dedicated data line associated with the given memory cell block, the dedicated one register circuit adapted to compare data read out of the given memory cell block with the data stored in the dedicated one register circuit;
   carrying out a memory cell access in an access cycle to read an item of data stored in a memory cell;
   at a start of a test operation section, storing data in the register circuits of the respective memory cell blocks as reference data; and
   during an access cycle:
      in each of the memory cell blocks, selecting at least one of a respective memory cell and a group of memory cells and activating a respective read amplifier to read data to be read out; and
      respectively carrying out a comparison between the data read out and the reference data in each of the register circuits.

6. The method according to claim 5, which further comprises carrying out an activation of the read amplifier of the second memory cell block with a time offset from an activation of the read amplifier of the first memory cell block.

7. The method according to claim 5, which further comprises activating read amplifiers of different ones of the memory cell blocks with a time offset.

8. The method according to claim 5, which further comprises activating read amplifiers of different ones of the memory cell blocks at different times.

9. A method of operating an integrated memory, which comprises:
   organizing memory cells into at least first and second memory cell blocks;
   respectively connecting data lines to read amplifiers;
   respectively reading out each of the memory cells through one of the read amplifiers and one of the data lines connected thereto;
   dedicating at least one of the data lines with each of the memory cell blocks for reading data therefrom;
   dedicating at least one writable register circuit to be written from outside the memory with each of the memory cell blocks, the register circuits adapted to store data and to compare the stored data with data applied to a respective one of the register circuits;
   connecting a dedicated one of the register circuits associated with a given one of the memory cell blocks to the dedicated data line associated with the given memory cell block, the dedicated one register circuit adapted to compare data read out of the given memory cell block with the data stored in the dedicated one register circuit;
   carrying out a memory cell access in an access cycle to read an item of data stored in a memory cell;
   at a start of a test operation section, storing data in the register circuits of the respective memory cell blocks as reference data; and
   during an access cycle:
      in each of the memory cell blocks, selecting at least one memory cell and activating a respective read amplifier to read out data; and
      respectively carrying out a comparison between the data read out and the reference data in each of the register circuits.

10. The method according to claim 9, which further comprises carrying out an activation of the read amplifier of the second memory cell block with a time offset from an activation of the read amplifier of the first memory cell block.

11. The method according to claim 9, which further comprises activating read amplifiers of different ones of the memory cell blocks with a time offset.

12. The method according to claim 9, which further comprises activating read amplifiers of different ones of the memory cell blocks at different times.

* * * * *